United States Patent
Yeh et al.

(10) Patent No.: US 6,207,565 B1
(45) Date of Patent: Mar. 27, 2001

(54) INTEGRATED PROCESS FOR ASHING RESIST AND TREATING SILICON AFTER MASKED SPACER ETCH

(75) Inventors: Edward K. Yeh, San Jose; Calvin Todd Gabriel, Cupertino; Samit Sengupta, San Jose, all of CA (US)

(73) Assignee: VLSI Technology, Inc, San Jose, CA (US)

( * ) Notice: Subject to any disclaimer, the term of this patent is extended or adjusted under 35 U.S.C. 154(b) by 0 days.

(21) Appl. No.: 09/483,461

(22) Filed: Jan. 13, 2000

(51) Int. Cl.$^7$ ................................................. C09K 13/00
(52) U.S. Cl. ..................... 438/669; 438/689; 438/710; 438/719; 438/723; 438/704
(58) Field of Search .................................... 438/689, 710, 438/719, 723, 669, 305, 963, 704

(56) References Cited

U.S. PATENT DOCUMENTS

| | | | |
|---|---|---|---|
| 4,892,845 | * | 1/1990 | Bridges ................................ 437/195 |
| 5,630,904 | * | 5/1997 | Aoyama et al. ..................... 438/669 |
| 5,895,245 | * | 4/1999 | Harvey et al. ....................... 438/305 |
| 6,000,411 | * | 12/1999 | Lee ....................................... 134/1.2 |
| 6,025,273 | * | 2/2000 | Chen et al. ........................... 438/706 |

* cited by examiner

*Primary Examiner*—Matthew Smith
*Assistant Examiner*—V. Yevsikov
(74) *Attorney, Agent, or Firm*—Wagner, Murabito & Hao LLP

(57) ABSTRACT

A method for preparing a semiconductor substrate for subsequent silicide formation. In one embodiment, the present invention subjects the semiconductor substrate to an ashing environment. In the present embodiment, the ashing environment is comprised of $H_2O$ vapor, and a gaseous fluorocarbon or a fluorinated hydrocarbon gas. In so doing, contaminants on the semiconductor substrate are removed. Next, the present invention subjects a mask covering a polysilicon stack to a mask-removal ashing environment. In the present embodiment, the mask-removal ashing environment is comprised of an $O_2$ plasma. In so doing, the mask covering the polysilicon stack is removed. As a result, the semiconductor substrate and the top surface of the polysilicon stack are prepared for subsequent silicide formation thereon.

14 Claims, 9 Drawing Sheets

Details of a recipe to perform the first embodiment ($CF_4/H_2O$ plasma treatment first followed by an $O_2$ ash) in a Mattson Aspen ashing system are given in Table I.

Table I. Recipe details for $CF_4/H_2O$ plasma first, ($O_2$ ash last) in a Mattson Aspen ashing system.

| Step number | Step 1 | Step 2 | Step 3 | Step 4 | Step 5 |
|---|---|---|---|---|---|
| RF Time (sec) | 0 | 2 | 88 | 2 | 13 |
| RF Power (W) | 0 | 975 | 900 | 975 | 900 |
| Pressure (Torr) | 3.5 | 0.5 | 1.2 | 0.5 | 1.1 |
| Gas 1: $O_2$ (sccm) | 5000 | 0 | 0 | 1000 | 3750 |
| Gas 2: $CF_4$ (sccm) | 0 | 360 | 360 | 0 | 0 |
| Gas 3: $H_2O$ (sccm) | 0 | 600 | 600 | 0 | 0 |
| Temperature (°C) | 250 | 250 | 250 | 250 | 250 |

FIG. 6

Effect of ash time on sheet resistance when $O_2$-based photoresist ashing steps come before ("first") or after ("last") the prior art $CF_4/H_2O$ plasma treatment step.

INTEGRATED PROCESS FOR ASHING RESIST AND TREATING SILICON AFTER MASKED SPACER ETCH

TECHNICAL FIELD

The present invention relates to the field of semiconductor device fabrication. More specifically, the present claimed invention relates to a method for preparing a semiconductor surface for subsequent silicide formation thereon.

BACKGROUND ART

During conventional semiconductor manufacturing, a lightly-doped drain (LDD) spacer is formed by blanket deposition and blanket etchback (spacer etch) of the silicon oxide material. Unfortunately, the fluorocarbon gases (such as $CF_4$ and $CHF_3$) used for spacer etching leave carbon and fluorine embedded in the silicon surface. These residues impair the subsequent formation of $TiSi_x$ by preventing deposited titanium from reacting with silicon on the surface. $TiSi_x$ formed on a contaminated silicon surface will have a higher sheet resistance than $TiSi_x$ formed on clean silicon. U.S. Pat. No. 5,895,245 (Harvey et. al.) discloses the use of a $CF_4/H_2O$ plasma to remove the carbon and fluorine residues left after spacer etch.

More recently, spacer etching has been done using a photoresist mask to prevent removal of oxide from certain regions of the wafer. The purpose of this masked spacer etch is to prevent $TiSi_x$ formation at those locations, thereby creating sections of the gate electrode with high resistivity. High resistivity in certain controlled locations can be advantageous to device designers; however, in general, the lowest possible resistivity is desired to make the device as fast as possible.

The photoresist mask must be removed after the spacer etch. Conventionally, this is done with an $O_2$ plasma. More specifically, in the prior art, process steps are performed in the following order. First, a masked spacer etch is performed. Next, an $O_2$ plasma ash is performed to remove the photoresist mask. The use of an $O_2$ plasma forms a layer of oxide on the wafer, covering the contaminants. After the $O_2$ plasma ash is performed, prior art processes treat the silicon surface with a $CF_4/H_2O$ plasma to remove contaminants. Following the aforementioned steps, titanium deposition and $TiSi_x$ formation processes are performed.

Unfortunately, the conventional process results in poor $TiSi_x$ formation and increased sheet resistance. Particularly, prior art processes tend to leave carbon and fluorine residues under the oxide formed by the $O_2$ plasma ash. Consequently, the subsequent $CF_4/H_2O$ process is prevented from removing the carbon and fluorine residues. These residues then impede the efficient formation of a silicide layer.

Thus, a need exists for a formation method which results in the lowest possible resistivity in certain desired regions of the semiconductor substrate. Yet another need exists for a formation method in which contaminants are not trapped on the surface of the semiconductor substrate and thus prevented from being removed.

DISCLOSURE OF THE INVENTION

The present invention provides a method for preparing a semiconductor substrate which results in nearly the lowest possible resistivity in selected regions. Additionally, the present invention provides for a method which does not allow contaminants to become trapped on the semiconductor substrate and thus not removable by conventional processing. The present invention achieves the above accomplishment by first utilizing an ashing method to remove contaminants from the semiconductor and then utilizing an ashing method which removes a photoresist mask.

Specifically, in one embodiment of the present invention, the present invention subjects the semiconductor substrate to an ashing environment. In the present embodiment, the ashing environment is comprised of $H_2O$ vapor, and a gaseous fluorocarbon or a fluorinated hydrocarbon gas. In so doing, contaminants on the semiconductor substrate are removed. Next, the present embodiment subjects a photoresist mask which covers portions of the semiconductor substrate (and features formed thereon) to a mask-removal ashing environment. In the present invention, the mask-removal ashing environment is comprised of an $O_2$ plasma. In so doing, remaining portions of the photoresist mask which covers portions of the semiconductor substrate (and features formed thereon) are removed. As a result, the semiconductor substrate and the top of the polysilicon stack are prepared for subsequent silicide formation steps. In so doing, the $TiSi_x$ will not form on selected regions, but will form well, without residue-induced impedance, on desired regions of the semiconductor substrate.

In another embodiment, the present invention first performs an $O_2$ plasma mask-removal ashing step to remove the photoresist mask. Next, the present embodiment performs an oxide etch step to remove the oxide that grew on the semiconductor substrate during the $O_2$ plasma mask-removal ashing step. The oxide etch may be performed with a hydrofluoric acid dip or by subjecting the semiconductor substrate to a $CF_4$ plasma ashing environment. Next, the present embodiment subjects the semiconductor substrate and the polysilicon stack to an ashing environment which is comprised of $H_2O$ vapor, and a gaseous fluorocarbon or a fluorinated hydrocarbon gas. As a result, the semiconductor substrate and the top of the polysilicon stack are prepared for subsequent silicide formation steps.

In still another embodiment, the present invention subjects the semiconductor substrate to a combination ashing environment This combination ashing environment combines an $O_2$ plasma, for removing the photoresist mask, with a $CF_4$ plasma to simultaneously remove the oxide which grows on the semiconductor substrate as a result of the $O_2$ plasma ashing. As a result, the silicon surface of the semiconductor substrate remains open and accessible for a treatment ashing step which removes contaminants on the semiconductor substrate. The treatment ashing environment is comprised of $H_2O$ vapor, and a gaseous fluorocarbon or a fluorinated hydrocarbon gas. As a result, the semiconductor substrate is prepared for subsequent silicide formation steps. In this embodiment of the present invention, the combination of an $O_2$ and $CF_4$ plasma ash can be performed either before or after the treatment ashing step.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 6 is a table providing recipe details in accordance with one embodiment of the present claimed invention.

It will be understood by those of ordinary skill in the art that other features and elements may be present on the semiconductor substrate but are not shown for the purpose of clarity. Additionally, the drawings referred to in this description should be understood as not being drawn to scale except if specifically noted.

BEST MODE FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Figure 1:
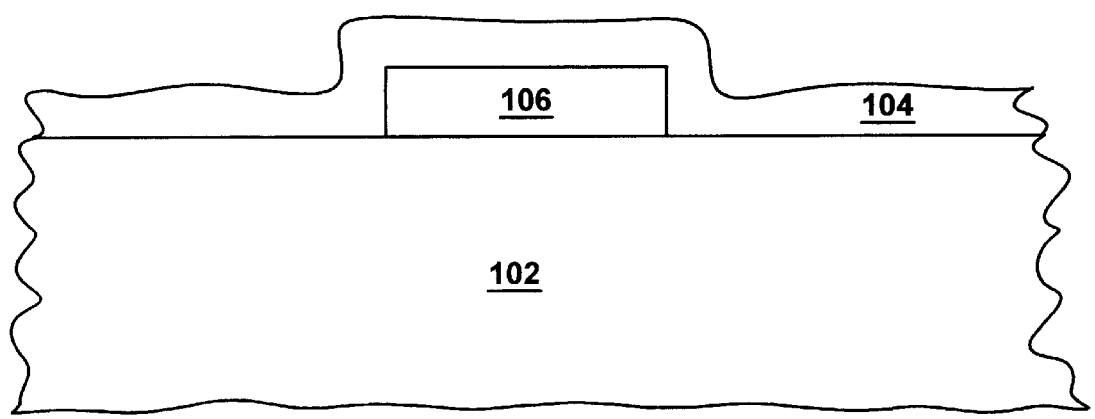
FIG. 1 is a cross sectional view illustrating the semiconductor substrate having a polysilicon stack formed thereon after blanket conformal deposition of an oxide or nitride layer in accordance with one embodiment of the present claimed invention.

With reference now to FIG. 1, a cross sectional view of a semiconductor substrate 102 having features formed thereon is shown. In the present embodiment, a semiconductor substrate 102 has a polysilicon stack 106 formed on the surface thereof. A layer of oxide 104 is deposited over the surface of substrate 102. Although, the present embodiment recites a layer of oxide 104 deposited over polysilicon stack 106 and semiconductor substrate 102, the present invention is well suited to the deposition of various other materials (e.g. nitride or other dielectric materials).

Figure 2:
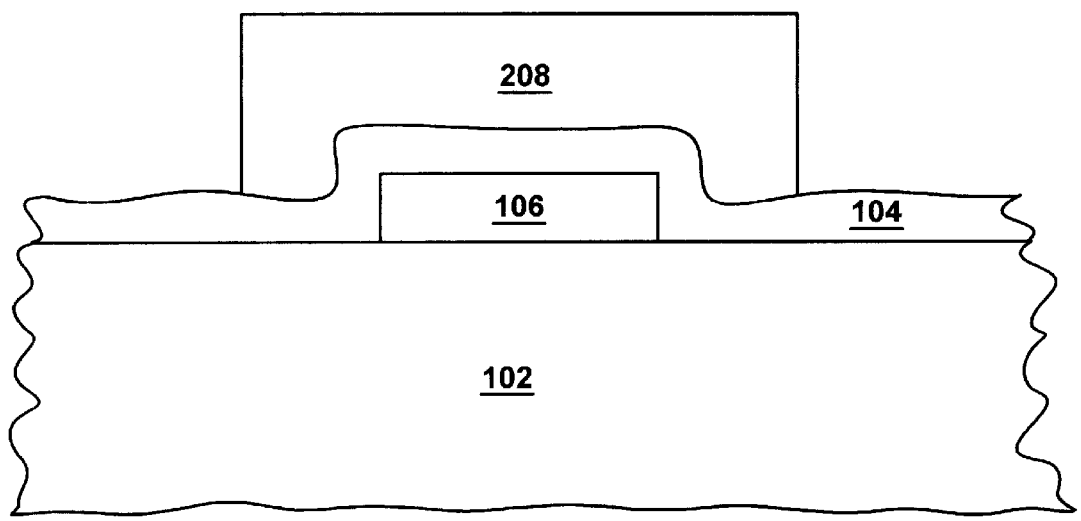
FIG. 2 is a cross sectional view illustrating a photoresist mask formed over the polysilicon stack and a portion of the semiconductor substrate in accordance with one embodiment of the present claimed invention.

With reference next to FIG. 2, a cross sectional view illustrating a process step subsequent to the oxide deposition step of FIG. 1 is shown. As shown in FIG. 2, in the present embodiment, a photoresist mask 208, is formed over select regions of oxide layer 104. More specifically, photoresist mask 208 covers the portion of oxide layer 104 which, in turn, covers polysilicon stack 106. Furthermore, photoresist mask 208 covers those portions of semiconductor substrate 102 which are adjacent to polysilicon stack 106. Photoresist mask 208 will be used to prevent removal of the underlying portions of oxide layer 104. It will be understood that photoresist mask 208 is typically formed by a blanket deposition of photosensitive material (e.g. photoresist); masking selected regions of the photosensitive material; exposing unmasked portions of the photosensitive material to, for example, light; and then removing the unexposed portions of the photosensitive material from semiconductor substrate 102.

Figure 3:
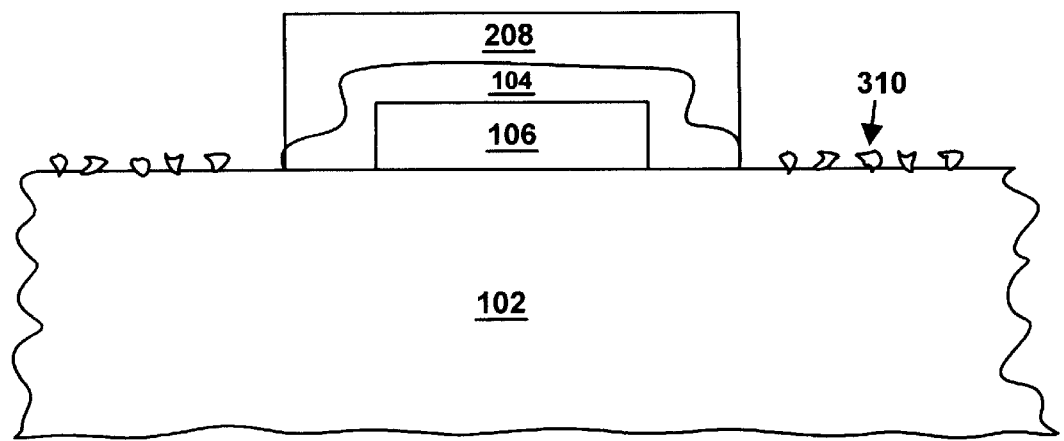
FIG. 3 is a cross sectional view illustrating a deleterious polymer residue formed on a portion of the semiconductor substrate wherein the polymer residue will be removed in accordance with one embodiment of the present claimed invention.

Referring now to FIG. 3, a cross sectional view illustrating a process step subsequent to the photo mask deposition step of FIG. 2 is shown. As shown in FIG. 3, oxide layer 104 is removed from above the portions of the semiconductor substrate 102 which are not covered by photoresist mask 208. Such an oxide etch step is performed using etchants selected from the group consisting of $CF_4$, $CHF_3$, or similar polyfluorinated hydrocarbons, in the present embodiment. After the oxide etch step, semiconductor substrate 102 may be contaminated such that it is not well suited for the formation of silicided regions thereon. In FIG. 3, contaminants typically shown as 310, resulting from the oxide etch, are shown on the surface of semiconductor substrate 102. As mentioned above, such contaminants impede the formation of a silicide.

In the present embodiment, after the oxide etch step, semiconductor substrate 102 is placed in an ashing environment such as, for example, an inductively-coupled plasma chamber. Although such an ashing environment is used in the present embodiment, the present invention is also well suited to the use of other well known ashing environments. As recited in steps 2 and 3 of the table 600 of FIG. 6, in one embodiment, the ashing environment first operates at a pressure of approximately 0.5 Torr and at a power of approximately 975 Watts for approximately 2 seconds, and then operates at a pressure of approximately 1.2 Torr and at a power of approximately 900 Watts for approximately 88 seconds.

In the present embodiment, $H_2O$ and $CF_4$ are introduced into the ashing environment. Referring again to steps 2 and 3 of the table of FIG. 6, the present embodiment introduces $H_2O$ at a flow rate of approximately 600 standard cubic centimeters per minute (SCCM). Also, in the present embodiment, $CF_4$ is introduced at a flow rate of approximately 360 SCCM. The present embodiment is also well suited to introducing fluorinated hydrocarbons such as $CHF_3$ or a gaseous polyfluorocarbon such as $C_2F_6$ instead of $CF_4$ into the ashing environment. Although the above flow rates are used in the present embodiment, the present invention is also well suited to varying the flow rates of the gases which are introduced into the ashing environment.

Figure 4:
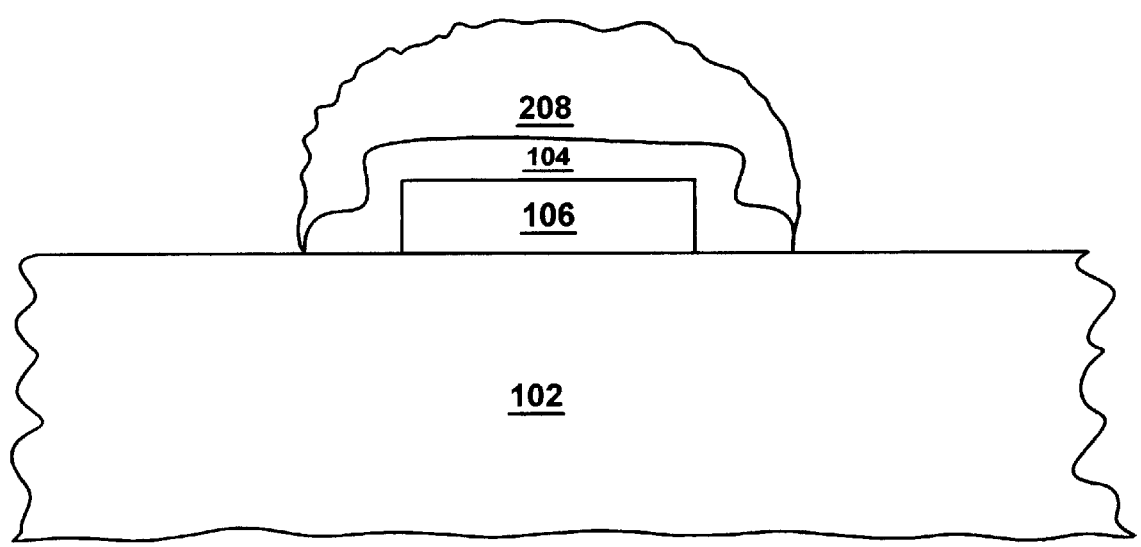
FIG. 4 is a cross sectional view illustrating slight erosion of the photoresist mask occurring as a result of a polymer residue removal step in accordance with one embodiment of the present claimed invention.

With reference now to FIG. 4, another cross-sectional view illustrating steps associated with an embodiment of the present invention is shown. In FIG. 4, semiconductor substrate 102 is now substantially free of contaminants 310 in accordance with the present invention. As shown in FIG. 4, a portion of the surface of photoresist mask 208 may be degraded by exposure to the ashing environment described above in accordance with FIG. 3. However, photoresist mask 208 still covers desired regions of oxide layer 104.

Figure 5:
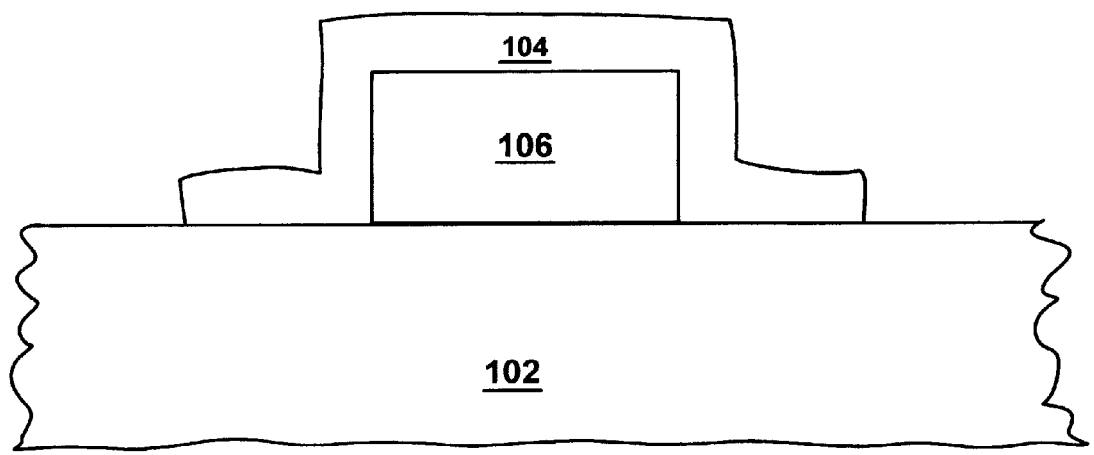
FIG. 5 is a cross sectional view illustrating a photoresist mask removal step in which the remaining portions of the photoresist mask have been removed in accordance with one embodiment of the present claimed invention.

Referring now to FIG. 5, a cross sectional view illustrating a process step subsequent to the ashing step of FIG. 4 is shown. As shown in FIG. 5, after the removal of contaminants 310 from the surface of semiconductor substrate 102, the present embodiment performs an $O_2$ plasma photoresist mask removal step. Specifically, in the present embodiment, after the ashing step of FIG. 4 removes contaminants 310, semiconductor substrate 102 is placed in an $O_2$ plasma ashing environment, such as, for example, an inductively-coupled plasma chamber, to remove photoresist mask 208. Although such an ashing environment is used in the present embodiment, the present invention is also well suited to the use of other well known ashing environments. As shown in FIG. 5, in the present embodiment, photoresist mask 208 is removed from above semiconductor substrate 102 with underlying oxide layer 104 still intact. Hence, by performing the $O_2$ plasma ashing step of FIG. 5 after the $CF_4/H_2O$ ashing step of FIG. 4, contaminants are not trapped on the surface of the semiconductor substrate as is found in the prior art. With photoresist mask 208 removed, and with the portion of oxide layer 104 above and to the sides of polysilicon stack 106 still in place, semiconductor substrate 102 is now ready for subsequent silicide formation processes without the threat of residue-induced defects.

Figure 7:
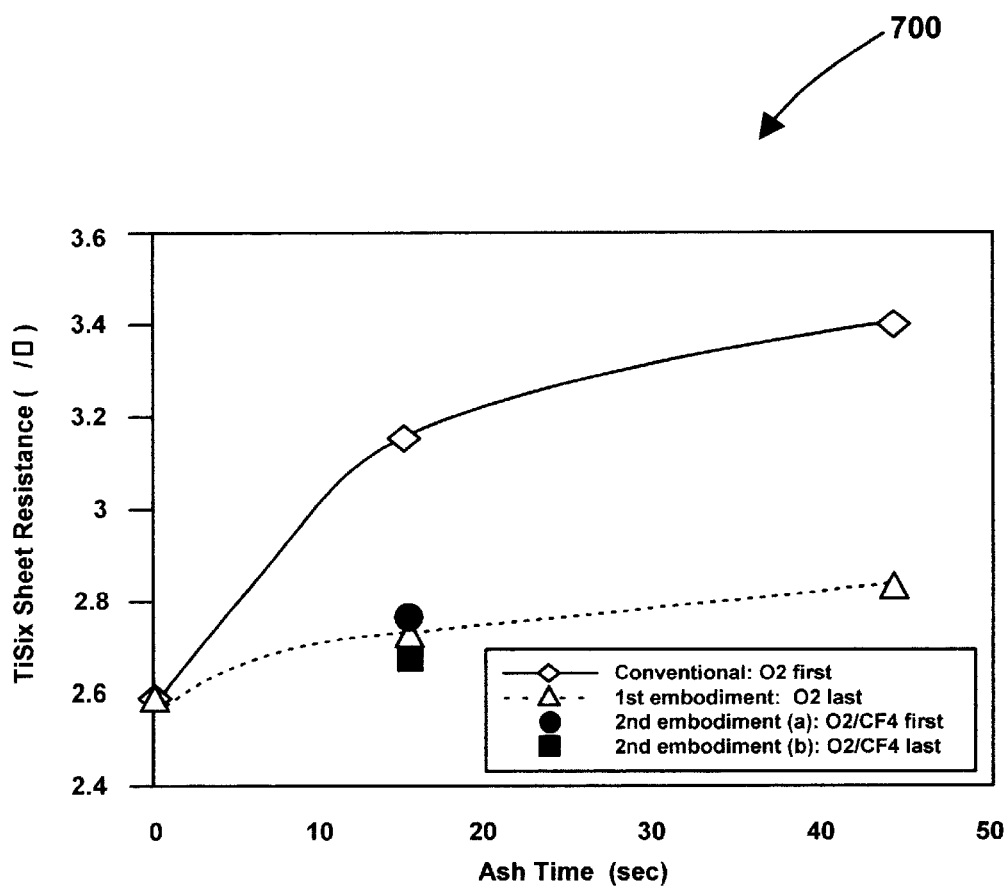
FIG. 7 is a graph illustrating the effect of ash time on $TiSi_x$ sheet resistance, comparing the results of conventional processing with the results of one embodiment of the present claimed invention.

With reference now to FIG. 7, a graph 700 illustrating the significant reduction in silicide sheet resistance achieved by the present invention is shown. As graph 700 shows, embodiments formed in accordance with the present invention (i.e. those labeled 1st embodiment, 2nd embodiment (a), and 2nd embodiment (b)) result in sheet resistances about 15% lower than those achieved by conventional processing and without the introduction of significant additional processing. The data point at zero ash time indicates the sheet resistance which can be achieved when unmasked spacer etching is done. (That is, when photoresist ashing is not needed.) Compared to the unmasked case, a conventional 15 second $O_2$ ash after masked spacer etch degrades sheet resistance by about 21%; however, with one embodiment of the present invention, $O_2$ ash after $CF_4/H_2O$ treatment degrades sheet resistance by only 6%. Thus, the present invention results in a 70% improvement over conventional processes.

Figure 8:
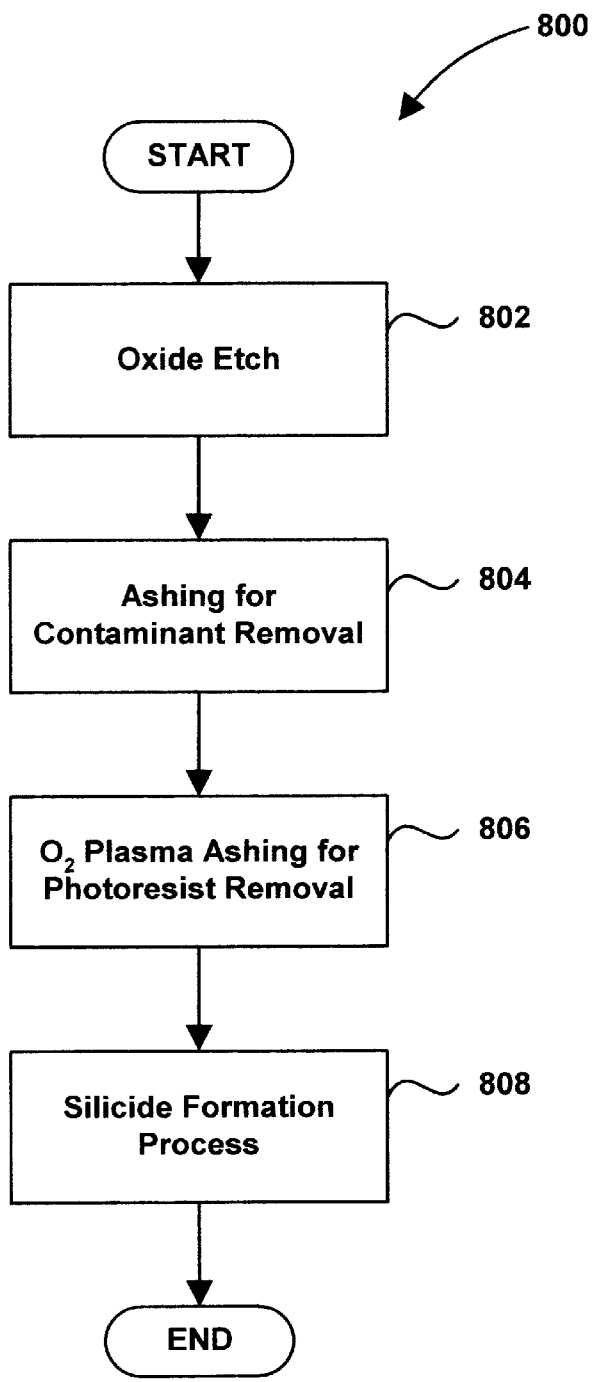
FIG. 8 is a flow chart of steps performed in accordance with one embodiment of the present claimed invention.

With reference now to FIG. 8, a flow chart 800 reciting steps of the above described embodiment of the present invention is shown. As shown in FIG. 8, the above-described embodiment of the present invention begins at step 802 with an oxide etch step. Specifically, portions of oxide layer 104 of FIGS. 1–3 are removed from above the portions of the semiconductor substrate 102 which are not covered by photoresist mask 208. The present oxide etch step is performed using etchants selected from the group consisting of $CF_4$, $CHF_3$, or similar polyfluorinated hydrocarbons, in the present embodiment.

At step 804, after oxide etch step 802, semiconductor substrate 102 of FIGS. 1–5 is placed in an ashing environment such as, for example, an inductively-coupled plasma chamber for contaminant removal. In the present embodiment, $H_2O$ and $CF_4$ are introduced into the ashing environment. The present embodiment is also well suited to introducing fluorinated hydrocarbons such as $CHF_3$ or a gaseous polyfluorocarbon such as $C_2F_6$ instead of $CF_4$ into the ashing environment. As a result, semiconductor substrate 102 is now substantially free of contaminants 310 of FIG. 3 in accordance with the present invention.

At step 806, after ashing step 804, the present embodiment places semiconductor substrate 102 in an $O_2$ plasma ashing environment, such as, for example, an inductively-coupled plasma chamber, to remove photoresist mask 208 of FIGS. 1–4. Hence, by performing $O_2$ plasma ashing step 806 after $CF_4/H_2O$ ashing step 804, contaminants are not trapped on the surface of the semiconductor substrate as is found in the prior art. With photoresist mask 208 removed, and with the portion of oxide layer 104 above and to the sides of polysilicon stack 106 still in place, semiconductor substrate 102 is now ready for subsequent silicide formation processes without the threat of residue-induced defects.

Referring still to step 806 of FIG. 8, in one embodiment, $O_2$ plasma ashing step 806 consists of three separate steps. In the first step, the mask-removal ashing environment operates at a pressure of approximately 0.5 Torr and a power of approximately 975 Watts for approximately 2 seconds. In such an embodiment, $O_2$ is introduced at a flow rate of approximately 1000 standard cubic centimeters per minute (SCCM), during the first step.

In the second step, the ashing environment operates at a pressure of approximately 1.1 Torr and a power of approximately 900 Watts for approximately 13 seconds. In this embodiment, $O_2$ is introduced at a flow rate of approximately 3750 standard cubic centimeters per minute (SCCM) during the second step. Although the above flow rates are used in VLSI3327. the present invention, the present invention is also well suited to varying the flow rates of the $O_2$ introduced into the ashing environment.

Next, at step 808, the present embodiment proceeds with subsequent silicide formation processes. That is, after semiconductor substrate 102 has been treated to remove contaminants and photoresist mask 208 has been removed, a wafer surface clean step, as is well known to those in the industry may be performed. As a result, the semiconductor substrate 102 is prepared for subsequent silicide formation therein. Finally, a rapid thermal anneal process, as is well known in the industry, can be performed without threat of contaminants impairing the formation of $TiSi_x$. Although the present embodiment specifically recites the use of titanium, the present invention is also well suited to using various other types of metals, such as, for example platinum, tungsten, cobalt, and the like in the silicide deposition steps.

Figure 9:
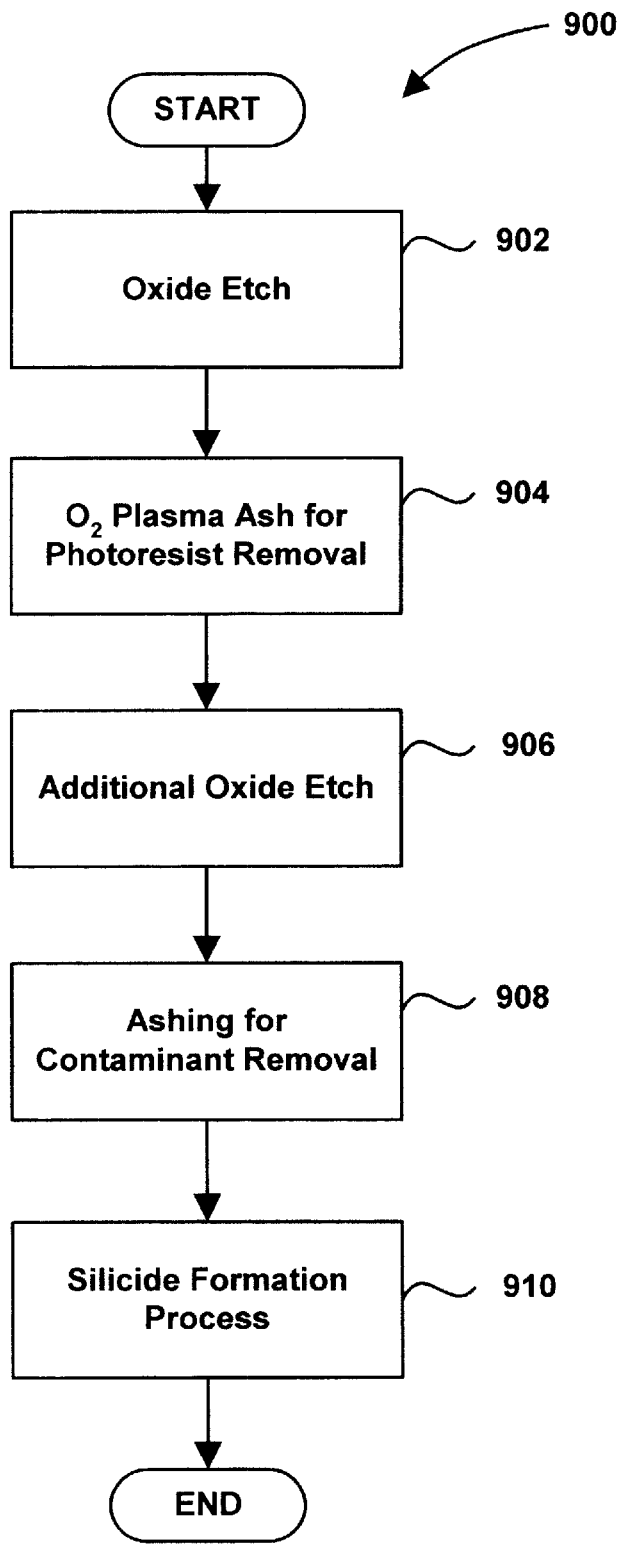
FIG. 9 is a flow chart of steps performed in accordance with one embodiment of the present claimed invention.

Referring now to FIG. 9, a flow chart 900 of steps performed in accordance with another embodiment of the present invention is shown. At step 902, portions of oxide layer 104 of FIGS. 1–3 are removed from above the portions of the semiconductor substrate 102 which are not covered by photoresist mask 208. The present oxide etch step is performed using etchants selected from the group consisting of $CF_4$, $CHF_3$, or similar polyfluorinated hydrocarbons, in the present embodiment.

At step 904, after oxide etch step 902, the present embodiment places semiconductor substrate 102 in a photomask removing environment. In this embodiment, the photomask removing environment is an $O_2$ plasma ashing environment, such as, for example, an inductively-coupled plasma chamber, to remove photoresist mask 208 of FIGS. 1–4. Hence, by performing $O_2$ plasma ashing step 904 after step 902, an oxide layer is grown on the semiconductor substrate 102 trapping contaminants underneath.

At step 906, after step 904, the present embodiment performs an oxide etch to remove the oxide that grew onto the semiconductor substrate 102 prior to steps 906. One embodiment of the present invention performs this oxide etch by using a hydrofluoric acid (HF) dip. Another embodiment of the present invention performs this oxide etch by using a dry plasma etch, such as $CF_4$. Regardless of which oxide etch method is used, the oxide trapping contaminants on the semiconductor substrate 102 is removed. The present invention then treats the surface of the semiconductor with the $CF_4/H_2O$ plasma to remove contaminants. As a result, the present invention prevents contaminants from being trapped on the semiconductor surface. Consequently, the present invention allows the $CF_4/H_2O$ plasma step to effectively remove carbon and fluorine residue contaminants.

In another embodiment of the present invention, steps 904 and 906, rather than using pure $O_2$ plasma to remove photoresist mask 208 and a separate oxide etch step, a mixture of $O_2$ plasma and an oxide etchant such as $CF_4$ is used. Because this combination ashing environment simultaneously etches oxide 104 and ashes photoresist mask 208, the surface of semiconductor substrate 102 remains open and accessible for treatment by the subsequent $CF_4/H_2O$ plasma. As a result, the present invention prevents contaminants from being trapped on the semiconductor surface. Consequently, the present invention allows step 908 to effectively remove carbon and fluorine residue contaminants.

At step 908, after oxide etch step 906, semiconductor substrate 102 of FIGS. 1–5 is placed in an ashing environment such as, for example, an inductively-coupled plasma chamber for contaminant removal. In the present embodiment, $H_2O$ and $CF_4$ are introduced into the ashing environment. The present embodiment is also well suited to introducing fluorinated hydrocarbons such as $CHF_3$ or a gaseous polyfluorocarbon such as $C_2F_6$ instead of $CF_4$ into the ashing environment. As a result, semiconductor substrate 102 is now substantially free of contaminants 310 of FIG. 3 in accordance with the present invention. With photoresist mask 208 removed, and with the portion of oxide layer 104 above and to the sides of polysilicon stack 106 still in place, semiconductor substrate 102 is now ready for subsequent silicide formation processes without the threat of residue-induced defects.

Next, at step 910, the present embodiment proceeds with subsequent silicide formation processes. That is, after semiconductor substrate 102 has been treated to remove contaminants and photoresist mask 208 has been removed, a wafer surface clean step, as is well known to those in the industry may be performed. As a result, semiconductor substrate 102 is prepared for subsequent silicide formation therein. Finally, a rapid thermal anneal process, as is well known in the industry, can be performed without threat of contaminants impairing the formation of $TiSi_x$. Although the present embodiment specifically recites the use of titanium, the present invention is also well suited to using various other types of metals, such as, for example platinum, tungsten, cobalt, and the like in the silicide deposition steps.

Thus, the present invention provides a method for preparing a semiconductor substrate which results in nearly the lowest possible resistivity in selected regions. Additionally, the present invention provides for a method for preparing a semiconductor substrate which does not allow contaminants to become trapped on the semiconductor substrate and thus unable to be removed by conventional processing.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method of preparing a semiconductor substrate for subsequent silicide formation wherein said semiconductor substrate has photomask material disposed thereover for preventing the removal of oxide from certain regions of said semiconductor substrate, said method comprising the steps of:
   a) exposing said semiconductor substrate to an oxide etch process such that said oxide is selectively removed from portions of said semiconductor substrate;
   b) after said step a), exposing said semiconductor substrate to an ashing environment, said ashing environment removing contaminants from at least said portions of said substrate from which said oxide was removed in said step a); and
   c) after said step b), exposing said semiconductor substrate to a photomask removing environment, said photomask removing environment removing said photomask material from above said semiconductor substrate, said photomask material previously deposited above selected regions of said semiconductor substrate, said step b) performed prior to said step c) such that silicide formation impeding residues are removed from the surface of said semiconductor substrate prior to depositing a metal to be used when forming a silicide on said semiconductor substrate.

2. The method as recited in claim 1 wherein said step b) further comprises the steps of:
   b1) introducing $CF_4$ into said ashing environment at a flow rate of approximately 360 SCCM; and
   b2) introducing $H_2O$ vapor into said ashing environment at a flow rate of approximately 600 SCCM such that said contaminants on said semiconductor substrate are removed.

3. The method as recited in claim 1 wherein step c) further comprises the steps of:
   c1) introducing $O_2$ into said photomask removing environment at a flow rate of approximately 1000 SCCM for approximately 2 seconds; and
   c2) introducing $O_2$ into said photomask removing environment at a flow rate of approximately 3750 SCCM for approximately 13 seconds.

4. The method as recited in claim 3 wherein step c1) further comprises the step of:
   c1i) operating said photomask removal environment at a pressure of approximately 0.5 Torr.

5. The method as recited in claim 3 wherein step c2) further comprises the step of:
   c2i) operating said photomask removal environment a pressure of approximately 1.1 Torr.

6. A method of preparing a semiconductor substrate for subsequent silicide formation wherein said semiconductor substrate has photomask material disposed thereover for preventing the removal of oxide from certain regions of said semiconductor substrate, said method comprising the steps of:
   a) exposing said semiconductor substrate to an oxide etch process such that oxide is selectively removed from portions of said semiconductor substrate;
   b) after said step a), exposing said semiconductor substrate to a photomask removing environment, said photomask removing environment removing said photomask material from above said semiconductor substrate, said photomask material previously deposited above selected regions of said semiconductor substrate;

c) after said step b), exposing said semiconductor substrate to an oxide removal environment, said oxide removal environment removing contaminants formed during said step b); and d) after said step c), exposing said semiconductor substrate to an ashing environment, said ashing environment removing contaminants from at least said portions of said substrate from which said oxide was removed in said step a), said step b) performed prior to said step c) such that silicide formation impeding residues are removed from the surface of said semiconductor substrate prior to depositing a metal to be used when forming a silicide on said semiconductor substrate.

7. The method as recited in claim 6 wherein said step d) further comprises the steps of:

d1) introducing $CF_4$ into said ashing environment at a flow rate of approximately 360 SCCM; and d2) introducing $H_2O$ vapor into said ashing environment at a flow rate of approximately 600 SCCM such that said contaminants on said semiconductor substrate are removed.

8. The method as recited in claim 6 wherein said step c) comprises:

exposing said semiconductor substrate to an HF dip.

9. The method as recited in claim 6 wherein said step c) comprises:

exposing said semiconductor substrate to an $CF_4$ plasma.

10. The method as recited in claim 6 wherein step b) further comprises the steps of:

b1) introducing $O_2$ into said photomask removing environment at a flow rate of approximately 1000 SCCM for approximately 2 seconds; and b2) introducing $O_2$ into said photomask removing environment at a flow rate of approximately 3750 SCCM for approximately 13 seconds.

11. The method as recited in claim 10 wherein step b1) further comprises the step of:

b1i) operating said photomask removal environment at a pressure of approximately 0.5 Torr.

12. The method as recited in claim 10 wherein step b2) further comprises the step of:

b2i) operating said photomask removing environment a pressure of approximately 1.1 Torr.

13. A method of preparing a semiconductor substrate and a polysilicon stack coupled to said semiconductor substrate for subsequent silicide formation wherein said semiconductor substrate has photomask material disposed thereover for preventing the removal of oxide from certain regions of said semiconductor substrate, said method comprising the steps of:

a) subjecting a mask, including photomask material, covering said polysilicon stack to a combination ashing environment, said combination ashing environment comprising an $O_2$ plasma and a $CF_4$ oxide etchant, such that said mask is removed and oxide is prevented from forming on said semiconductor substrate; and b) subjecting said semiconductor substrate to a treatment ashing environment, said treatment ashing environment comprising $H_2O$ vapor, and a gaseous fluorocarbon or a fluorinated hydrocarbon gas, such that contaminants introduced into said semiconductor substrate are removed.

14. The method as recited in claim 13 wherein step b) further comprises the steps of:

b1) introducing $CF_4$ into said treatment ashing environment at a flow rate of approximately 360 SCCM; and b2) introducing $H_2O$ vapor into said treatment ashing environment at a flow rate of approximately 600 SCCM.

* * * * *